(12) United States Patent
Zhu et al.

(10) Patent No.: US 10,109,809 B2
(45) Date of Patent: Oct. 23, 2018

(54) FLEXIBLE SUBSTRATE

(71) Applicants: Kunshan New Flat Panel Display Technology Center Co., Ltd., Kunshan (CN); Kunshan Go-Visionox Opto-Electronics Co., Ltd., Kunshan (CN)

(72) Inventors: Shaopeng Zhu, Kunshan (CN); Yong Qiu, Beijing (CN); Hong Chen, Kunshan (CN); Hideo Hirayama, Kunshan (CN); Xiuqi Huang, Kunshan (CN)

(73) Assignees: Kunshan New Flat Panel Display Technology Center Co., Ltd., Kunshan (CN); Kunshan Go-Visionox Opto-Electronics Co., Ltd., Kunshan (CN)

( * ) Notice: Subject to any disclaimer, the term of this patent is extended or adjusted under 35 U.S.C. 154(b) by 490 days.

(21) Appl. No.: 14/758,388

(22) PCT Filed: Dec. 27, 2013

(86) PCT No.: PCT/CN2013/090642
§ 371 (c)(1),
(2) Date: Jun. 29, 2015

(87) PCT Pub. No.: WO2014/101814
PCT Pub. Date: Jul. 3, 2014

(65) Prior Publication Data
US 2015/0357589 A1   Dec. 10, 2015

(30) Foreign Application Priority Data
Dec. 28, 2012 (CN) .......................... 2012 1 0584605

(51) Int. Cl.
*H01L 51/00* (2006.01)
*B32B 27/14* (2006.01)
(Continued)

(52) U.S. Cl.
CPC ............ *H01L 51/0097* (2013.01); *B32B 3/10* (2013.01); *B32B 27/14* (2013.01);
(Continued)

(58) Field of Classification Search
CPC ......... H01L 2924/0002; H01L 2924/00; H01L 23/562; H01L 2924/12044; H01L 51/5256;
(Continued)

(56) References Cited

U.S. PATENT DOCUMENTS 6,268,695 B1 * 7/2001 Affinito ............... H01L 51/5256
                                                                  313/504
6,570,325 B2   5/2003 Graff et al.
(Continued)

FOREIGN PATENT DOCUMENTS

CN      102084515 A    6/2011
CN      102593381 A    7/2012
(Continued)

OTHER PUBLICATIONS

Search Report & First Office Action for Priority Chinese Patent Application No. 201210584605.0, dated Oct. 8, 2014.
(Continued)

*Primary Examiner* — Samir Shah
*Assistant Examiner* — Alicia J Sawdon
(74) *Attorney, Agent, or Firm* — The Webb Law Firm

(57) ABSTRACT

A flexible substrate includes a polymer substrate and a plurality of water and oxygen barrier layers provided on the polymer substrate. A planarization layer is provided between the adjacent water and oxygen barrier layers. The planariza-
(Continued)

tion layer includes a plurality of planarization units separated in a first direction and a second direction. A projection of the planarization unit in the planarization layer projected on the polymer substrate covers a gap between projections of adjacent planarization units in an adjacent planarization layer projected on the polymer substrate, and projection regions partially overlap. The adjacent planarization layers can cover the gap between the planarization units to prevent the water and oxygen horizontal from penetrating to ensure that the flexible substrate can be cut into any size within the range lager than the size of the planarization unit.

19 Claims, 2 Drawing Sheets

(51) Int. Cl.
*B32B 3/10* (2006.01)
*H01L 51/52* (2006.01)

(52) U.S. Cl.
CPC ...... *H01L 51/0034* (2013.01); *H01L 51/0035* (2013.01); *H01L 51/5256* (2013.01); *B32B 2264/102* (2013.01); *B32B 2307/7244* (2013.01); *B32B 2307/7265* (2013.01); *B32B 2457/00* (2013.01); *H01L 2251/5338* (2013.01); *H01L 2251/566* (2013.01); *Y02E 10/549* (2013.01); *Y02P 70/521* (2015.11); *Y10T 428/24521* (2015.01)

(58) Field of Classification Search
CPC ............... H10M 2/08; B32B 17/10568; B32B 2307/7244; B32B 2307/7265; B32B 2457/00; B32B 3/10; H01M 2/08; Y10T 428/24521
USPC ............ 257/E23.194; 428/156–173, 98, 594
See application file for complete search history.

(56) References Cited

U.S. PATENT DOCUMENTS

| | | | |
|---|---|---|---|
| 2003/0207500 A1* | 11/2003 | Pichler | ................ H01L 51/5253 438/127 |
| 2007/0196682 A1* | 8/2007 | Visser | ................... H01L 23/562 428/594 |
| 2010/0151209 A1 | 6/2010 | Wei et al. | |
| 2010/0155709 A1 | 6/2010 | Hack et al. | |
| 2013/0171902 A1 | 7/2013 | Wang et al. | |

FOREIGN PATENT DOCUMENTS

| | | |
|---|---|---|
| CN | 103022354 A | 4/2013 |
| JP | 2003282239 A | 10/2003 |
| JP | 2010528417 A | 8/2010 |

OTHER PUBLICATIONS

Supplementary Search Report & Second Office Action for Priority Chinese Patent Application No. 201210584605.0, dated Jun. 8, 2015.
Third Office Action for Priority Chinese Patent Application No. 201210584605.0, dated Nov. 5, 2015.
Extended European Search Report & Written Opinion for parallel European Patent Application No. 13869184.5, dated Jul. 22, 2016.
Office Action (Notice of Grounds for Rejection) for parallel Japanese Patent Application No. 2015-549975, dated Oct. 4, 2016.
First Office Action for parallel Korean Patent Application No. 10-2015-7020532, dated Sep. 27, 2016.
Second Office Action for parallel Korean Patent Application No. 10-2015-7020532, dated Feb. 23, 2017.
Office Action for parallel Taiwan Patent Application No. 102148352 dated May 28, 2015.

* cited by examiner

FLEXIBLE SUBSTRATE

CROSS-REFERENCE TO RELATED APPLICATIONS

This application is the United States national phase of International Application No. PCT/CN2013/090642 filed Dec. 27, 2013, and claims priority to Chinese Patent Application No. 201210584605.0 filed Dec. 28, 2012, the disclosures of which are hereby incorporated in their entirety by reference.

FIELD OF THE INVENTION

The present disclosure relates generally to the field of organic optoelectronics, and more specifically to a flexible substrate which is a water and oxygen barrier for manufacturing organic optoelectronic devices such as OLED, OPV and OTFT.

BACKGROUND OF THE INVENTION

The most favorable property of organic optoelectronic devices such as organic light-emitting diodes (OLED), organic photovoltaic (OPV), organic thin film transistor (OTFT), and organic semiconductor lasers (OSL), is that they are flexible. The organic optoelectronic devices can be made with a flexible polymer substrate such as polyethylene (PE), polypropylene (PP), polystyrene (PS), polyethersulfone (PES), polyethylene naphthalate (PEN) and polyimide (PI). The polymer substrate enable the organic optoelectronic devices to be flexible and rolled into arbitrary shape.

An organic optoelectronic device is very sensitive to the water and oxygen erosion, and trace amounts of water and oxygen will cause oxidation, crystallization or electrode degradation of organic materials in the device, which will affect device life or lead directly to the failure of the device. Compared with glass substrate, the water or oxygen transmittance of the most polymer substrate is relatively high to be not enough to guarantee the device keep long term reliable operation. The water permeation rate and oxygen permeation rate of common polymer substrates are shown in the table below.

| Polymer Substrate | Water Permeation Rate ($g/m^2 \cdot d$) 37~40° C. | Oxygen Permeation Rate ($cc/m^2 \cdot d$) 20~23° C. |
| --- | --- | --- |
| PE  | 1.2~5.9 | 70~550 |
| PP  | 1.5~5.9 | 93~300 |
| PS  | 7.9~40  | 200~540 |
| PES | 14      | 0.04 |
| PEN | 7.3     | 3.0 |
| PI  | 0.4~21  | 0.04~17 |

In the prior art, the polymeric substrate is generally alternately provided with a planarization layer and a water and oxygen barrier layer to increase the water and oxygen barrier capacity of the polymeric substrate. As shown in FIG. 1, water and oxygen barrier layers 103 are provided on the polymeric substrate 101 and separated by a planarization layer 102. The water and oxygen barrier layer 103 is used to isolate water vapor and oxygen, and a planarization layer 102 is provided between the adjacent water and oxygen barrier layers 103 in order to guarantee the compactness and smoothness of the film formation and inhibit the growth of the defect in the film. Generally, three to five or more water and oxygen barrier layers 103 should be provided on the polymeric substrate to have the water and oxygen barrier capacity adapted to produce organic optoelectronic devices. However, the planarization layer 102 is generally a polymer material layer, which has a poor water and oxygen barrier capacity, and when the polymeric substrate has to be cut, the side surface after cutting will be exposed to the external air that the water vapor and oxygen will infiltrate into the device along the path indicated by the arrowhead, so that there is only one oxygen barrier layer 103 playing a barrier role, which seriously influences the performance of the device.

To solve this problem, for an existing flexible substrate, it has to define the size of the substrate at first, and then define the coverage areas of the water and oxygen barrier layer and the planarization layer based on the size with making the coverage area of the planarization layer smaller than that of the water and oxygen barrier layer, so that multiple layers of water and oxygen barriers can be connected with each other on the edge of the flexible substrate to prevent the water vapor and oxygen from infiltrating from the side. However, this solution brings a problem that the prepared flexible substrate cannot be cut to meet to the requirement for different product sizes, and the product with a different size needs a set of masks adapted to its size to define the sizes of the planarization layer and the water and oxygen barrier layer, which undoubtedly increases the production cost.

In addition, roll-to-roll coating is known as an efficient means for ramping up the production capacity of the flexible substrate with water and oxygen barrier films and reducing production cost, but the technology must involve a process of cutting, the roll-to-roll is unsuitable for the above preparation method for water and oxygen barrier films, thus the production cost cannot be effectively reduced.

SUMMARY OF THE INVENTION

Based on the above, it is necessary to provide a new cuttable flexible substrate with a lower production cost.

According to one aspect of the present disclosure, a flexible substrate includes a polymer substrate and a plurality of water and oxygen barrier layers provided on the polymer substrate, wherein a planarization layer is provided between the adjacent water and oxygen barrier layers, the planarization layer includes a plurality of planarization units separated in a first direction and a second direction, a projection of the planarization unit in the planarization layer projected on the polymer substrate covers a gap between projections of adjacent planarization units in an adjacent planarization layer projected on the polymer substrate, and projection regions partially overlap.

Preferably, the water and oxygen barrier layer covers a gap between the planarization units.

Preferably, the thicknesses of odd layers or even layers of the planarization layers are respectively decreased successively in a direction away from the polymer substrate.

Preferably, the angle between the first direction and the second direction is greater than 0° and less than 180°.

Preferably, the planarization units in the planarization layer are periodically arranged in the first direction and the second direction.

Preferably, the position difference between the projections of the planarization units in the adjacent planarization layers projected on the polymer substrate is a half cycle.

Preferably, the thickness of the planarization layer is in a range of 100-5000 nm.

Preferably, the width of the projection of the planarization unit projected on the polymer substrate is in a range of 10-2000 μm in any direction.

Preferably, the spacing distance between the projections of the adjacent planarization units in a same planarization layer projected on the polymer substrate is in a range of 10-2000 μm.

The shapes of the projections of the planarization units in a same planarization layer projected on the polymer substrate may be the same or different.

In addition, the shapes of the projections of the planarization units in different planarization layers projected on the polymer substrate may be the same or different.

Preferably, the planarization layer is produced by ink-jet printing-ultraviolet curing, flash evaporation-ultraviolet curing, chemical vapor deposition, vapor-phase polymerization or plasma polymerization.

Preferably, the planarization layer is made of a polymer. The polymer used by different planarization layers may be the same or different. The polymer is at least one selected from the group consisting of polyacrylate, parylene, polyurea, polyethylene glycol terephthalate, polyethylene naphthalate and polystyrene.

Preferably, the thickness of the water and oxygen barrier layer is in a range of 20-200 nm. The thicknesses of different water and oxygen barrier layers may be the same or different.

Preferably, the water and oxygen barrier layer can be produced by direct current sputtering, radio frequency sputtering, reactive sputtering, plasma enhanced chermic vapor deposition or atomic layer deposition.

Preferably, the material of the water and oxygen barrier layer is at least one selected from the group consisting of aluminium oxide, silicon oxide, silicon nitride, titanium oxide, zirconium oxide, aluminum oxynitride, silicon oxynitride and amorphous carbon. The materials of different water and oxygen barrier layers may be the same or different.

Compared with the prior art, the above technical solution of the present disclosure has the following advantages.

1. The planarization layer in the flexible substrate of the present disclosure is composed by a plurality of planarization units separated in a first direction and a second direction. The projection of the planarization unit in the planarization layer projected on the polymer substrate covers a gap between projections of planarization units in an adjacent planarization layer, and projection regions partially overlap. Therefore, the adjacent planarization layers can cover the gap between the planarization units to prevent the water and oxygen horizontal penetrating to ensure the flexible substrate can be cut into any size within the range lager than the size of the planarization unit, so that it can realize a large scale production of the flexible substrate and also simplify processes to reduce production costs.

2. The thicknesses of odd layers or even layers of the planarization layers are decreased successively in a direction away from the polymer substrate that the roughness of the top plane of the flexible substrate can be reduced, which is suitable for the preparation of the device.

3. The planarization units in the planarization layer are periodically arranged in the first direction and the second direction, and the position difference between the projections of the planarization units in the adjacent planarization layers projected on the polymer substrate is a half cycle. The rule of the configuration of the planarization units is easy to be realized in the technology, which can make sure the planarization layers can cover the gap between the units to prevent the water and oxygen horizontal penetrating.

4. The sizes of the planarization layer and the planarization unit are larger, and the requirement of their preparation precision is low, so they are easy to be realized in the technology.

5. The thicknesses of the planarization layer and the water and oxygen barrier layer in the flexible substrate of the present disclosure are low, so the thicknesses of the device using the flexible substrate can be effectively reduced.

BRIEF DESCRIPTION OF THE DRAWINGS

The accompanying drawings illustrate one or more embodiments of the present disclosure; the drawings, together with the written description, serve to explain the principles of the present disclosure. Wherever possible, the same reference signs are used throughout the drawings to refer to the same or like units of an embodiment.

The reference signs are listed as follows: 101 polymer substrate, 102 planarization layer, 103 water and oxygen barrier layer, 201 polyimide substrate, 202 first water and oxygen barrier layer, 203 first planarization layer, 204 second water and oxygen barrier layer, 205 second planarization layer, 206 third water and oxygen barrier layer, 207 third planarization layer, 208 fourth water and oxygen barrier layer, 209 fourth planarization layer, 210 fifth water and oxygen barrier layer, 301 odd planarization layer, and 302 even planarization layer.

DETAILED DESCRIPTION OF THE INVENTION

In the following description of embodiments, reference is made to the accompanying drawings which form a part hereof, and in which it is shown by way of illustration specific embodiments of the present disclosure that can be practiced. It is to be understood that other embodiments can be used and structural changes can be made without departing from the scope of the disclosed embodiments.

Embodiment 1

Figure 1:
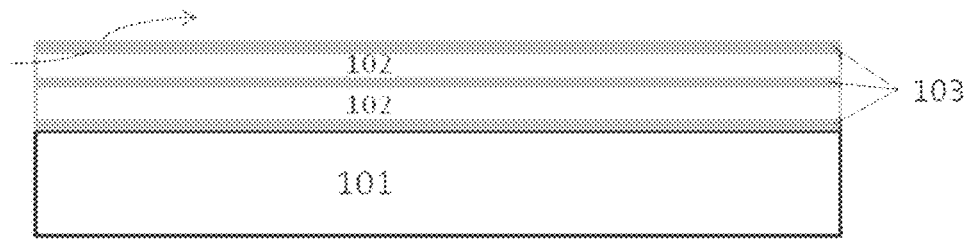
FIG. 1 is a cross-sectional view illustrating a flexible substrate with water and oxygen barrier films in the prior art.
Figure 2:
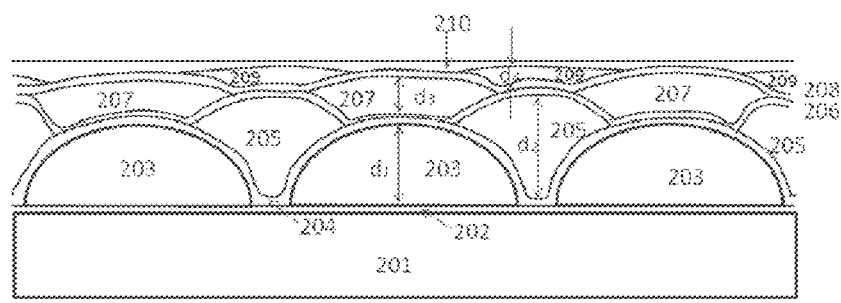
FIG. 2 is a cross-sectional view illustrating a flexible substrate according to one embodiment of the present disclosure.

As shown in FIG. 2, a flexible substrate in the embodiment includes a polyimide substrate 201 (hereafter referred to as a PI substrate), and on the PI substrate, a first water and oxygen barrier layer 202, a first planarization layer 203, a second water and oxygen barrier layer 204, a second planarization layer 205, a third water and oxygen barrier layer 206, a third planarization layer 207, a fourth water and oxygen barrier layer 208, a fourth planarization layer 209 and a fifth water and oxygen barrier layer 210 are sequentially stacked.

In the embodiment, the first planarization layer 203, the second planarization layer 205, the third planarization layer 207 and the fourth planarization layer 209 are composed by separated planarization units which are periodically arranged in a first direction and a second direction. The water and oxygen barrier layer covers the gap between the planarization units to prevent the water and oxygen horizontal penetrating.

Figure 3:
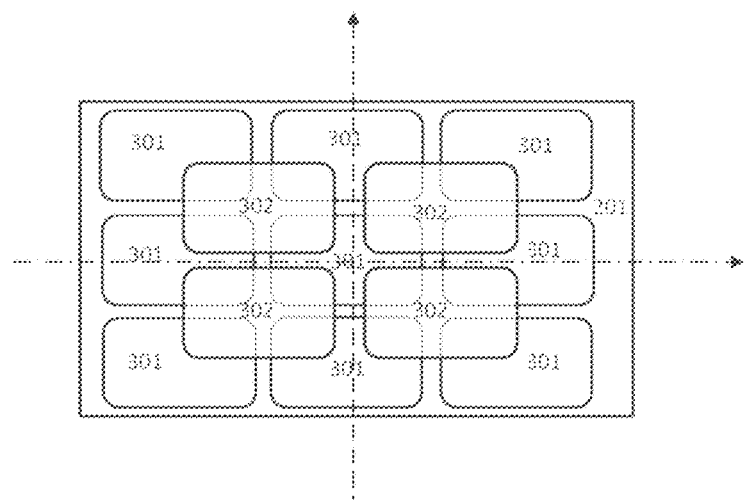
FIG. 3 is a diagram illustrating locations of projections of planarization units in adjacent planarization layers in a flexible substrate according to one embodiment of the present disclosure.

As shown in FIG. 3, the first direction is illustrated by the direction of the arrow of the chain dotted line, and the second direction is illustrated by the direction of the arrow of the dashed line. In the embodiment, the angle between the first direction and the second direction is 90°. In addition, in the odd planarization layer 301 and the even planarization layer 302, the shapes of the projections of every planarization units projected on the PI substrate 201 are the same. Each projection has a shape of a same-sized rectangle with a length of 500 μm and a width of 400 μm. The spacing distances between the adjacent rectangles are the same in the first and second directions and equal to 100 μm. The projections of the planarization units in the adjacent planarization layers projected on the PI substrate 201 are arranged in a position difference of a half cycle.

In this embodiment, the thickness $d_1$ of the first planarization layer 203 is 3,000 nm, the thickness $d_2$ of the second planarization layer 205 is 3,000 nm, the thickness $d_3$ of the third planarization layer 207 is 1,500 nm, and the thickness $d_4$ of the fourth planarization layer 209 is 400 nm. The thickness $d_3$ of the third planarization layer 207 is less than the thickness $d_1$ of the first planarization layer 203. The thickness $d_4$ of the fourth planarization layer 209 is less than the thickness $d_2$ of the second planarization layer 205.

Optionally, if the flexible substrate has more planarization layers, they should meet the following condition: the thickness of the $n^{th}$ planarization layer is less than that of the $(n-2)^{th}$ planarization layer (n is a natural number and n>2).

The position differences between the planarization units in the second planarization layer 205 and the first planarization layer 203, in the third planarization layer 207 and the second planarization layer 205, and in the fourth planarization layer 209 and the third planarization layer 207 are each a half cycle, so the center of a planarization unit in one planarization layer of two adjacent planarization layers is located over the gap between two planarization units in the other planarization layer of the two adjacent planarization layers to prevent the water and oxygen horizontal from penetrating. In addition, the planarization units are separated completely from each other in the first direction and the second direction that the flexible substrate can be cut in any size within the range of being lager than the size of the planarization unit, so that it can realize a large scale production of the flexible substrate, such as roll-to-roll technology. Because the size of the planarization unit is large, and the requirement of their preparation precision is low, so they are easy to be realized in the technology.

Optionally, the PI substrate can be selected from other polymer flexible substrates, such as PET, PEN, PES, PE, PP and PS.

The planarization layer is made of a polymer, such as polyacrylate, parylene, polyurea, polyethylene glycol terephthalate, polyethylene naphthalate, polystyrene, etc. In the embodiment, the first planarization layer 203, the second planarization layer 205, the third planarization layer 207 and the fourth planarization layer 209 are made of an identical material, preferably polyacrylate, and are prepared by ink-jet printing-ultraviolet curing technology.

Optionally, the preparation method for the planarization layer also can be flash evaporation-ultraviolet curing, chemical vapor deposition, vapor-phase polymerization or plasma polymerization. The first planarization layer 203, the second planarization layer 205, the third planarization layer 207 and the fourth planarization layer 209 also can be made of different materials respectively selected from the group consisting of polyacrylate, parylene, polyurea, polyethylene glycol terephthalate, polyethylene naphthalate and polystyrene, etc.

In this embodiment, the thicknesses of the first water and oxygen barrier layer 202, the second water and oxygen barrier layer 204, the third water and oxygen barrier layer, the fourth water and oxygen barrier layer 208 and the fifth water and oxygen barrier layer 210 are the same and are 50 nm. The above water and oxygen barrier layers are made of same material that silicon nitride, and are prepared by plasma enhanced chermic vapor deposition (PECVD) technology.

Optionally, the thickness of the water and oxygen barrier layer is 20-200 nm. The preparation method for the water and oxygen barrier layer also can be selected from the group consisting of magnetron sputtering, radio frequency sputtering, reactive sputtering, plasma enhanced chermic vapor deposition and atomic layer deposition. Different water and oxygen barrier layers can be made of different materials selected from the group consisting of aluminium oxide, silicon oxide, silicon nitride, titanium oxide, zirconium oxide, aluminum oxynitride, silicon oxynitride and amorphous carbon.

Embodiment 2

Referring to FIG. 2, the flexible substrate in this embodiment is similar to that of Embodiment 1. The difference lies in that the shape of the projections of the planarization units in the first planarization layer 203, the second planarization layer 205, the third planarization layer 207 and the fourth planarization layer 209 on the PI substrate 201 is different from that of Embodiment 1.

Figure 4:
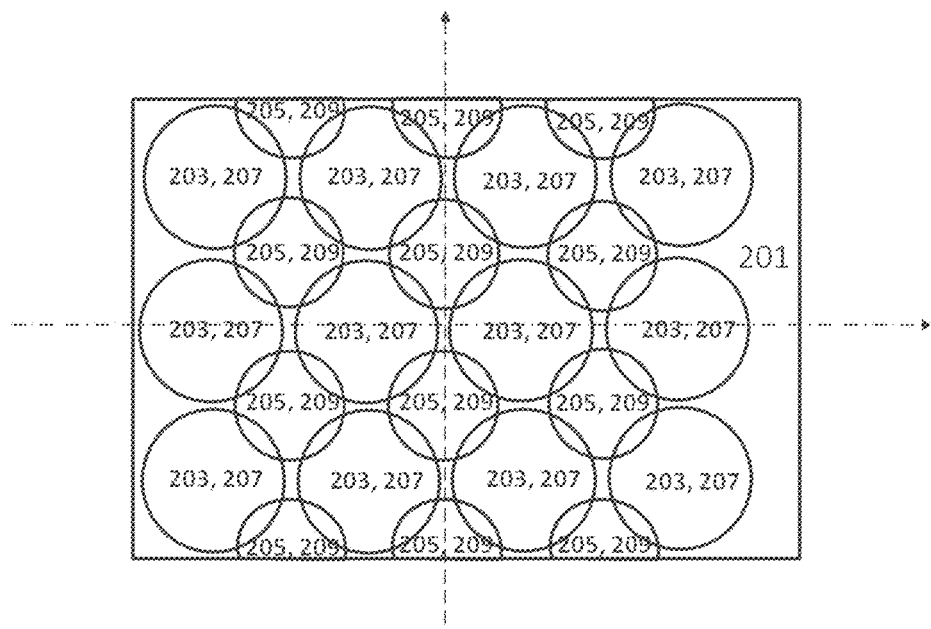
FIG. 4 is a diagram illustrating locations of projections of planarization units in adjacent planarization layers in a flexible substrate according to an additional embodiment of the present disclosure.

In the embodiment, as shown in FIG. 4, the projections of the planarization units in the first planarization layer 203 and the third planarization layer 207 on the PI substrate 201 are circles with the same radius and the projections overlap. The radius of the circle is 800 μm. As shown in FIG. 4, the first direction is illustrated by the direction of the arrow of the chain dotted line, and the second direction is illustrated by the direction of the arrow of the dashed line. The spacing distances between adjacent circles are the same in the first direction and the second direction, and are 200 μm. The projections of the planarization units in the second planarization layer 205 and the fourth planarization layer 209 on the PI substrate 201 are circles with radii of 500 μm, and the projections on the PI substrate 201 overlap.

In this embodiment, the thickness $d_1$ of the first planarization layer is 2,000 nm, the thickness $d_2$ of the second planarization layer is 1,800 nm, the thickness $d_3$ of the third planarization layer is 500 nm, and the thickness $d_4$ of the fourth planarization layer is 600 nm.

The center of the planarization unit in one planarization layer is located on the gap between the planarization units in the other planarization layer for two adjacent planarization layers to prevent the water and oxygen horizontal penetrating to ensure the flexible substrate can be cut in any size within a range lager than the size of the planarization unit, so that it can realize a large scale production of the flexible substrate and also simplify processes to reduce production costs. The thicknesses of odd layers or even layers of the planarization layers are decreased successively away from the polymer substrate that the roughness of the top plane of the flexible substrate can be reduced, which is suitable for the preparation of the device.

Embodiment 3

Figure 5:
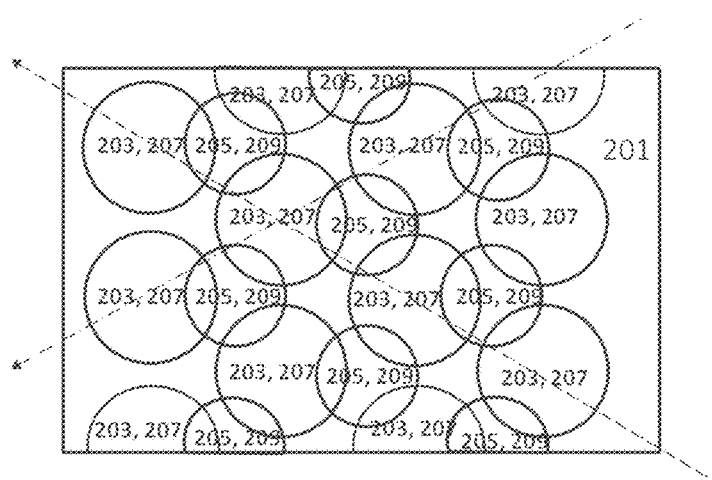
FIG. 5 is a diagram illustrating locations of projections of planarization units in adjacent planarization layers in a flexible substrate according to a further embodiment of the present disclosure.

Referring to FIG. 2, the flexible substrate is similar to Embodiment 1. The difference lies that the arrangement of the projections of the planarization units in the first planarization layer 203, the second planarization layer 205, the third planarization layer 207 and the fourth planarization layer 209 on the PI substrate 201 is different from that of Embodiments 1 and 2. In Embodiment 1 and Embodiment 2, the planarization units are periodically arranged in the first direction and the second direction, and the angle between the two directions is 90°. However, in the embodiment, as shown in FIG. 5, the first direction is illustrated by the direction of the arrow of the chain dotted line, the second direction is illustrated by the direction of the arrow of the dashed line, the planarization units are periodically arranged in the first direction and the second direction, and the angle between the two directions is 60°.

The projections of the planarization units in the first planarization layer 203 and the third planarization layer 207 on the PI substrate 201 are circles with same radius. The projections of the planarization units in the first planarization layer 203 and the third planarization layer 207 on the PI substrate 201 overlap, and the radius of the projected circle is 800 μm. The spacing distances between adjacent circles are the same in the first direction and the second direction and are 200 μm. The projections of the planarization units in the second planarization layer 205 and the fourth planarization layer 209 on the PI substrate 201 are also circles with same radius, and the radius of each circle is 500 μm. The projections of the planarization units in the second planarization layer 205 and the fourth planarization layer 209 on the PI substrate 201 overlap.

In the present embodiment, the thickness $d_1$ of the first planarization layer is 2,000 nm, the thickness $d_2$ of the second planarization layer is 1,800 nm, the thickness $d_3$ of the third planarization layer is 500 nm, and the thickness $d_4$ of the fourth planarization layer is 600 nm.

In adjacent planarization layers, the position difference between the projections of the planarization units on the PI substrate is a half cycle, and the center of the planarization unit in one planarization layer is located on the gap between the planarization units in the other planarization layer for two adjacent planarization layers to prevent the water and oxygen horizontal penetrating to ensure the flexible substrate can be cut in any size within the range of being lager than the size of the planarization unit, so that it can realize a large scale production of the flexible substrate and also simplify processes to reduce production costs. The thicknesses of odd layers or even layers of the planarization layers are decreased successively away from the polymer substrate that the roughness of the top plane of the flexible substrate can be reduced, which is suitable for the preparation of the device.

In the embodiments of the present disclosure, the number of layers of the water and oxygen barrier layer and the planarization layer is not limited, and the number can be increased or decreased according to intended use and need of the flexible substrate.

Optionally, the planarization unit can be in arbitrary shape, the shapes of the planarization units in a same planarization layer can be the same or different, the shapes of the planarization units in different planarization layers can be the same or different, the projection of the planarization unit in the planarization layer projected on the polymer substrate covers a gap between projections of planarization units in an adjacent planarization layer, and projection regions partially overlap to make sure adjacent planarization layers can cover the gap between the planarization units to prevent the water and oxygen horizontal penetrating. As shown in FIG. 3, the relative positions of adjacent odd and even planarization layers projected on the polymer substrate overlap, and the projections of planarization units in the odd and even layers projected on the substrate overlap. The thickness of the planarization layer is in a range of 100-5000 nm, and the width of the projection of the planarization unit projected on the polymer substrate is in a range of 10-2000 μm in any direction. The spacing distance between adjacent planarization units in a same planarization layer is in a range of 10-2000 μm along the first direction or the second direction, and the thicknesses of odd layers or even layers of the planarization layers are decreased successively away from the polymer substrate, eventually making the surface planar.

The above embodiments are chosen and described in order to explain the principles of the present disclosure and their practical application so as to activate others skilled in the art to utilize the present disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A flexible substrate, comprising:
   a polymer substrate;
   at least three water and oxygen barrier layers provided on the polymer substrate; and
   a planarization layer; provided between adjacent water and oxygen barrier layers, wherein each planarization layer comprises a plurality of planarization units separated in a first direction and a second direction, a projection of each planarization unit in the planarization layer projected on the polymer substrate covers a gap between projections of adjacent planarization units in an adjacent planarization layer projected on the polymer substrate, and projection regions partially overlap, and
   wherein thicknesses of the planarization layers decrease successively in a direction away from the polymer substrate.

2. The flexible substrate of claim 1, wherein each water and oxygen barrier layer covers a gap between the adjacent planarization units.

3. The flexible substrate of claim 1, wherein the planarization units in the planarization layer are periodically arranged in the first direction and the second direction.

4. The flexible substrate of claim 1, wherein the position difference between the projections of the planarization units in the adjacent planarization layers projected on the polymer substrate is a half cycle.

5. The flexible substrate of claim 1, wherein the thickness of the planarization layer is in a range of 100-5000 nm.

6. The flexible substrate of claim 1, wherein the width of the projection of the planarization unit projected on the polymer substrate is in a range of 10-2000 μm in any direction.

7. The flexible substrate of claim 1, wherein a spacing distance between the projections of the adjacent planarization units in a same planarization layer projected on the polymer substrate is in a range of 10-2000 μm.

8. The flexible substrate of claim 1, wherein the shapes of the projections of the planarization units in a same planarization layer projected on the polymer substrate are the same.

9. The flexible substrate of claim 1, wherein the shapes of the projections of the planarization units in different planarization layers projected on the polymer substrate are the same.

10. The flexible substrate of claim 1, wherein the planarization layer is produced by ink-jet printing-ultraviolet curing, flash evaporation-ultraviolet curing, chemical vapor deposition, vapor-phase polymerization or plasma polymerization.

11. The flexible substrate of claim 1, wherein the planarization layer is made of a polymer which is at least one selected from the group consisting of polyacrylate, parylene, polyurea, polyethylene glycol terephthalate, polyethylene naphthalate and polystyrene.

12. The flexible substrate of claim 1, wherein the thickness of each water and oxygen barrier layer is in a range of 20-200 nm.

13. The flexible substrate of claim 1, wherein each water and oxygen barrier layer is produced by magnetron sputtering, direct current sputtering, radio frequency sputtering, reactive sputtering, plasma enhanced chemical vapor deposition or atomic layer deposition.

14. The flexible substrate of claim 1, wherein the material of each water and oxygen barrier layer is at least one selected from the group consisting of aluminum oxide, silicon oxide, silicon nitride, titanium oxide, zirconium oxide, aluminum oxynitride, silicon oxynitride and amorphous carbon.

15. The flexible substrate of claim 3, wherein the position difference between the projections of the planarization units in the adjacent planarization layers projected on the polymer substrate is a half cycle.

16. The flexible substrate of claim 5, wherein the width of the projection the planarization unit projected on the polymer substrate is in a range of 10-2000 μm in any direction.

17. The flexible substrate of claim 5, wherein a spacing distance between the projections of the adjacent planarization units in a same planarization layer projected on the polymer substrate is in a range of 10-2000 μm.

18. The flexible substrate of claim 8, wherein the shapes of the projections of the planarization units in different planarization layers projected on the polymer substrate are the same.

19. The flexible substrate of claim 10, wherein the planarization layer is made of a polymer which is at least one selected from the group consisting of polyacrylate, parylene, polyurea, polyethylene glycol terephthalate, polyethylene naphthalate and polystyrene.

* * * * *